United States Patent
Heo et al.

(10) Patent No.: US 12,408,569 B2
(45) Date of Patent: *Sep. 2, 2025

(54) TITANIUM SILICON NITRIDE BARRIER LAYER

(71) Applicant: Eugenus, Inc., San Jose, CA (US)

(72) Inventors: Jae Seok Heo, Dublin, CA (US); Jerry Mack, San Jose, CA (US); Somilkumar J. Rathi, San Jose, CA (US); Niloy Mukherjee, San Ramon, CA (US)

(73) Assignee: Eugenus, Inc., San Jose, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 18/488,851

(22) Filed: Oct. 17, 2023

(65) Prior Publication Data

US 2024/0276896 A1     Aug. 15, 2024

Related U.S. Application Data

(63) Continuation of application No. 16/595,912, filed on Oct. 8, 2019, now Pat. No. 11,832,537.

(51) Int. Cl.
*H10N 70/00* (2023.01)
*H10B 63/00* (2023.01)

(52) U.S. Cl.
CPC ......... *H10N 70/8413* (2023.02); *H10B 63/24* (2023.02); *H10N 70/826* (2023.02)

(58) Field of Classification Search
CPC .................. H01L 45/126; H01L 45/1233
See application file for complete search history.

(56) References Cited

U.S. PATENT DOCUMENTS

| 7,253,108 B2 | 8/2007 | Zonca |
| 7,910,911 B2 | 3/2011 | Breitwisch et al. |
| (Continued) | | |

FOREIGN PATENT DOCUMENTS

| CN | 102832342 A | 12/2012 |
| EP | 1676934 A1 | 7/2006 |
| (Continued) | | |

OTHER PUBLICATIONS

Office Action dated Aug. 28, 2024 in Japanese Application No. 2022-520983, 7 pages.

(Continued)

*Primary Examiner* — Yu-Hsi D Sun
(74) *Attorney, Agent, or Firm* — Knobbe Martens Olson & Bear LLP

(57) ABSTRACT

The disclosed technology generally relates to a barrier layer comprising titanium silicon nitride, and more particularly to a barrier layer for nonvolatile memory devices, and methods of forming the same. In one aspect, a method of forming an electrode for a phase change memory device comprises forming over a semiconductor substrate an electrode comprising titanium silicon nitride (TiSiN) on a phase change storage element configured to store a memory state. Forming the electrode comprises exposing a semiconductor substrate to one or more cyclical vapor deposition cycles, wherein a plurality of the cyclical vapor deposition cycles comprises an exposure to a Ti precursor, an exposure to a N precursor and an exposure to a Si precursor.

19 Claims, 7 Drawing Sheets

(56) References Cited

U.S. PATENT DOCUMENTS

| | | |
|---|---|---|
| 8,470,635 B2 | 6/2013 | Cha et al. |
| 9,099,473 B2 | 8/2015 | Kim et al. |
| 9,159,608 B2 | 10/2015 | Park et al. |
| 9,412,602 B2 | 8/2016 | Blomberg et al. |
| 11,832,537 B2 | 11/2023 | Heo et al. |
| 2003/0108674 A1 | 6/2003 | Chung et al. |
| 2004/0077183 A1* | 4/2004 | Chung .................. C23C 16/34 438/785 |
| 2005/0006722 A1 | 1/2005 | Zonca |
| 2006/0003557 A1 | 1/2006 | Cabral et al. |
| 2006/0182885 A1 | 8/2006 | Lei et al. |
| 2007/0166980 A1 | 7/2007 | Lee et al. |
| 2008/0210923 A1 | 9/2008 | Sato |
| 2008/0273378 A1 | 11/2008 | Phillip et al. |
| 2009/0137081 A1 | 5/2009 | Chang et al. |
| 2009/0189136 A1 | 7/2009 | Matsuzaki |
| 2009/0275198 A1 | 11/2009 | Kamepalli et al. |
| 2010/0117053 A1 | 5/2010 | Sekar et al. |
| 2010/0151681 A1 | 6/2010 | Knapp et al. |
| 2011/0127485 A1 | 6/2011 | Cha et al. |
| 2013/0256624 A1 | 10/2013 | Kau |
| 2015/0050806 A1 | 2/2015 | Park et al. |
| 2015/0221863 A1 | 8/2015 | Song et al. |
| 2015/0279683 A1 | 10/2015 | Harada |
| 2016/0149127 A1 | 5/2016 | Kau |
| 2018/0347040 A1 | 12/2018 | Vats et al. |
| 2018/0350657 A1 | 12/2018 | Vats et al. |
| 2019/0067015 A1 | 2/2019 | Wagatsuma et al. |
| 2021/0047727 A1 | 2/2021 | Monden et al. |

FOREIGN PATENT DOCUMENTS

| | | |
|---|---|---|
| JP | 2008-053494 A | 3/2008 |
| JP | 2011 523503 A | 8/2011 |
| JP | 2014 530491 A | 11/2014 |
| JP | 2015 514161 A | 5/2015 |
| JP | 2015 193878 A | 11/2015 |
| KR | 1020040050802 A1 | 6/2004 |
| TW | 200945642 A | 11/2009 |
| TW | 201445001 A | 12/2014 |

OTHER PUBLICATIONS

Office Action dated Sep. 26, 2024 in Korean Application No. 10-2022-7015425, 18 pages.

Raoux, S. et al., "Phase Change Materials and Phase Change Memory," MRS Bulletin, 2014, vol. 39, pp. 703-710.

Guha, S. et al., "Synthesis and Characterization of Titanium Silicon Nitride (TiSiN) Thin Film: A Review," IOP Conf. Ser.: Mater. Sci. Eng., 2018, vol. 377, pp. 1-13.

Wong, H. et al., "Phase Change Memory," Proceedings of the IEEE, 2010, vol. 98 (12) pp. 1-27.

International Search Report and Written Opinion dated Dec. 23, 2020 in Application No. PCT/US2020/050641.

International Preliminary Report on Patentability dated Apr. 21, 2022 in Application No. PCT/US2020/050641 in 10 pages.

Office Action dated May 6, 2024 in Taiwan Application No. 109134680, 17 pages.

* cited by examiner

TITANIUM SILICON NITRIDE BARRIER LAYER

INCORPORATION BY REFERENCE

This application is a continuation of U.S. patent application Ser. No. 16/595,912, filed Oct. 8, 2019, the entire disclosure of which is incorporated herein by reference in its entirety.

BACKGROUND

Field

The disclosed technology generally relates to a barrier layer comprising titanium silicon nitride, and more particularly to a barrier layer for nonvolatile memory devices, and methods of forming the same.

Description of the Related Art

Nonvolatile memory or storage devices can be switched between memory states, e.g., logic 1 and 0 states, by changing a physical state of a storage element. For example, some nonvolatile memory devices, e.g., flash memory devices, can be switched between memory states by transferring charge to and from a floating gate configured as the storage element. Some other nonvolatile or storage devices can be switched between memory states by changing a resistance across a storage element. The latter type of nonvolatile memory devices include phase change memory (PCM) devices, which include a phase change material in the storage element. The PCM devices can be switched by inducing phase changes including crystallization and amorphization in the phase change material of the storage element.

Diffusion barriers for PCM devices serve a plurality of purposes that take advantage of structural, thermal, and electrical properties. However, the need for continued dimensional scaling, improved performance, low temperature integration, conformality, tunable resistance, voltage/current scaling and/or three-dimensional (3D) integration of PCM devices, among other trends, is driving a corresponding need for improved diffusion barriers for PCM devices and methods of forming the same.

SUMMARY

In one aspect, a method of forming an electrode for a phase change memory device comprises forming over a semiconductor substrate an electrode comprising titanium silicon nitride (TiSiN) on a phase change storage element configured to store a memory state. Forming the electrode comprises exposing a semiconductor substrate to one or more vapor deposition cycles, wherein a plurality of the vapor deposition cycles comprises an exposure to a Ti precursor, an exposure to a N precursor and an exposure to a Si precursor.

In another aspect, a method of forming a phase change memory device comprises forming over a semiconductor substrate a memory cell comprising a diffusion barrier comprising titanium silicon nitride (TiSiN) and a phase change storage element. Forming the diffusion barrier comprises exposing the semiconductor substrate to one or more vapor deposition cycles, wherein a plurality of the vapor deposition cycles comprises an exposure to a titanium (Ti) precursor, an exposure to a nitrogen (N) precursor and an exposure to a silicon (Si) precursor.

In another aspect, nonvolatile memory device comprises a diffusion barrier formed over a semiconductor substrate, wherein the diffusion barrier comprises titanium silicon nitride (TiSiN) and is interposed between a phase change storage element and an adjacent structure comprising a selection device or a metallization structure. The diffusion barrier has a silicon concentration such that the diffusion barrier has an electrical resistivity between about 500 $\mu\Omega$-cm and about 30,000 $\mu\Omega$-cm.

In another aspect, a method of forming a barrier layer comprising titanium silicon nitride (TiSiN) at a temperature between 200° ° C. and 390° C. comprises exposing a semiconductor substrate to one or more vapor deposition cycles, wherein at least one of the vapor deposition cycles comprises an exposure to a titanium (Ti) precursor, an exposure to a nitrogen (N) precursor and an exposure to a silicon (Si) precursor

BRIEF DESCRIPTION OF THE DRAWINGS

Embodiments of this disclosure will now be described, by way of non-limiting example, with reference to the accompanying drawings.

DETAILED DESCRIPTION

Figure 1:
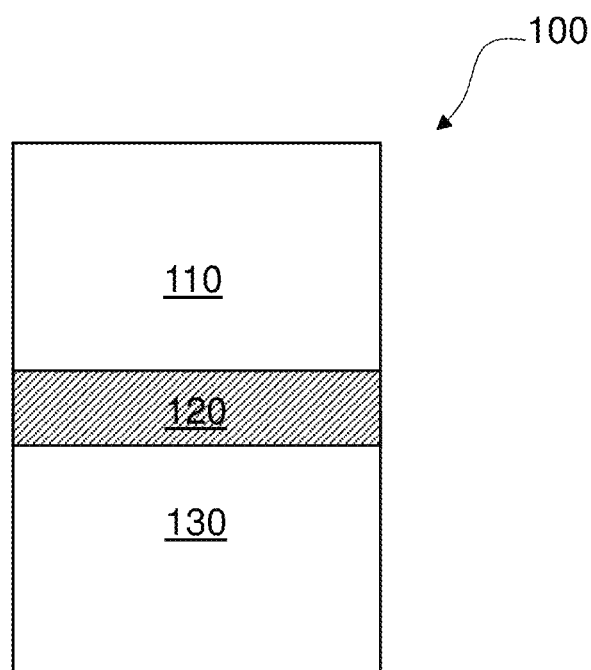
FIG. 1 schematically illustrates a phase change memory device, according to embodiments.

As described above, the need for continued dimensional scaling, improved performance, voltage/current scaling and/or three-dimensional (3D) integration of PCM devices, among other trends, is in turn driving a corresponding need for improved diffusion barriers, which can serve as electrode, and methods of forming the same. The areas of improvement in materials characteristics include resistivity tunability for voltage/cell scaling and/or for optimizing heat generation; diffusion barrier capability for reducing contamination and cross contamination between adjacent elements including the phase change storage element; thermal insulation capability for reducing energy consumption during write/erase operations; and reduced film roughness for reducing device parameter variability, among other material characteristics. In addition, as the PCM devices continue to scale, electrodes may be formed in features having increasingly smaller dimensions, higher aspect ratios and complex topologies. For example, some electrodes may be configured as a heater electrode, which may be formed in high (e.g., >1) aspect ratio vias or trenches. In addition, as the technology node scales down to 10 nm node and beyond, there may be a need for electrode layers that can conformally line high aspect ratio trenches and vias having dimensions as small as few nanometers, e.g., for lateral memory cell scaling and/or 3D integration of the memory cells. In addition, for integrating the PCM devices at one or more metallization levels, the deposition temperature for the electrode layer should not exceed the thermal budget for the back-end-of-line (BEOL) part of the process flow, which can be as low as 400° ° C. or below.

While various materials have been used to form diffusion barriers or electrodes in various PCM devices, further improvement may be provided with respect to one or more of the above areas of improvement. For example, TiN has been used for its relatively high diffusion barrier performance. However, because TiN has relatively low electrical resistivity, when formed to serve as a heating electrode, the electrode can have very small lateral or cross sectional dimensions in order to increase the resistance of the electrode. A tunable resistivity may provide more flexibility for feature dimensions. In addition, because TiN has a relatively low thermal resistivity, the energy consumed during write/erase operations may be relatively high. Furthermore, while electrodes for PCM devices are often deposited using techniques such as physical vapor deposition (PVD) and chemical vapor deposition (CVD), the increased need for conformality of the electrodes layers as described above may eventually limit their usage.

Thus, in recognition of these and other needs, disclosed herein is a method of depositing a layer comprising TiSiN, and various memory structures formed using the same. According to various embodiments, a method of forming a thin film comprising titanium silicon nitride (TiSiN) comprises exposing a semiconductor substrate to one or more cyclical vapor deposition cycles, which can be ALD cycles such as thermal ALD cycles, comprising an exposure to a Ti precursor, an exposure to a N precursor and an exposure to a Si precursor. The thin film can serve as an electrode, a diffusion barrier and/or a heater, among other purposes, for various IC devices including a phase change memory device.

As described herein, a compound referred to by its constituent elements without specific stoichiometric ratios thereof shall be understood to encompass all possible non-zero concentrations of each element unless explicitly limited. For example, titanium nitride (TiN) shall be understood to encompass all possible stoichiometric and nonstoichiometric compositions of titanium nitride that can be expressed by a general formula $Ti_xN$, where x>0, including TiN, $Ti_3N_4$, $Ti_4N_3$, $Ti_6N_5$, $Ti_2N$ and $TiN_2$ as well as other non-stoichiometric compositions of Ti and N. Similarly, silicon nitride (SiN) shall be understood to encompass all possible stoichiometric and nonstoichiometric compositions of silicon nitride that can be expressed by a general formula $Si_yN$, including $Si_3N_4$, where y>0. Similarly, titanium silicon nitride (TiSiN) shall be understood to encompass all possible stoichiometric and nonstoichiometric compositions of titanium silicon nitride that can be expressed by a general formula $Ti_xSi_yN$, where x>0 and y>0.

FIG. 1 illustrates an example structure, e.g., part of a memory cell stack, of a nonvolatile memory device 100, e.g., a PCM device, that can be fabricated using the methods disclosed herein, according to embodiments. The nonvolatile memory device 100 comprises an electrode 120, e.g., a diffusion barrier electrode, comprising titanium silicon nitride (TiSiN) interposed between a phase change storage element 110 and an adjacent structure 130, according to various embodiments. The phase change storage element 110 is configured to store a plurality of memory states, which can be nonvolatile or persistent memory states. In some embodiments, the adjacent structure 130 comprises a selector device electrically connected in series to the phase change storage element 110. The selector device is configured as a switch for controlling voltage or current that may be provided by a voltage or current source to the phase change storage element 110 for switching the phase change storage element 110 between or among the plurality of memory states. In some other embodiments, the adjacent structure 130 may be a metallization structure, which can include a metallization line, a contact structure or other conductive paths formed of a metallic material for electrically connecting the phase change storage element 110 to the control circuitry. In some implementations, the electrode 120 may be contact one or both of the phase change storage element 110 and the adjacent structure 130. However, in other implementations intervening layers or structures may be present between the electrode 120 and one or both of the phase change storage element 110 and the adjacent structure 130.

Figure 2:
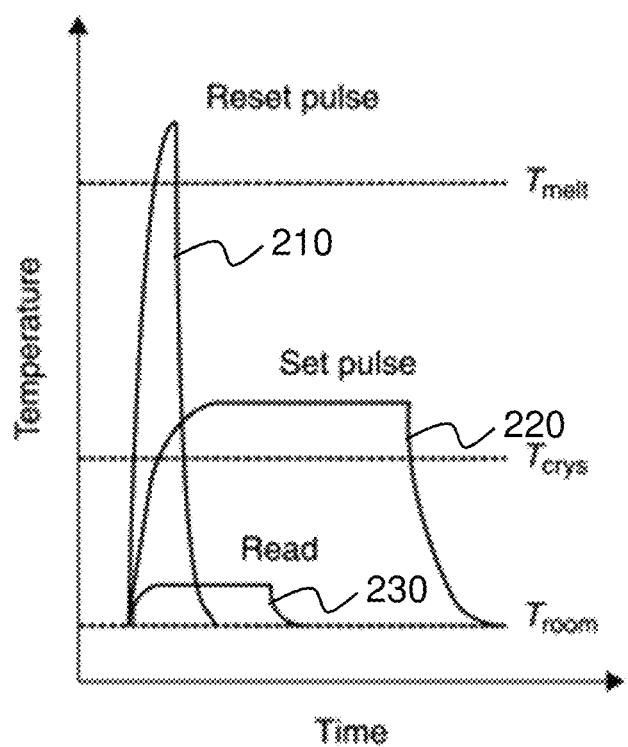
FIG. 2 schematically illustrates exemplary access operations that can be performed on a phase change memory device.

FIG. 2 schematically illustrates exemplary access operations that can be performed on the nonvolatile memory device 100 illustrated above in FIG. 1. An operation to induce a crystalline-to-amorphous transition in the phase change storage element 110 (FIG. 1), or a RESET operation, is performed by applying a RESET pulse 210, e.g., a current or voltage pulse to the phase change storage element 110 (FIG. 1) in a low resistance state or SET state comprising a substantially crystalline phase change material. The pulse can be applied using a selector device (e.g., adjacent structure 130 in FIG. 1) to control the duration and/or magnitude thereof. The RESET pulse 210 causes the phase change material of the phase change storage element 130 (FIG. 1) to at least partly melt at the melting temperature (Tmelt) of the phase change material. After a peak of the RESET pulse 210 is reached, the phase change storage element is rapidly quenched within a time duration that is short enough to prevent substantial recrystallization of the phase change material.

Still referring to FIG. 2, an operation to induce an amorphous-to-crystalline transition of the phase change material, or a SET operation, is performed by applying a SET pulse 220, e.g., a current or voltage pulse to the phase change storage element 110 (FIG. 1) in a high resistance RESET state comprising a substantially amorphous phase change material. The pulse can be applied by the selector device (e.g., adjacent structure 130 in FIG. 1) to control the duration and/or magnitude thereof. The SET pulse 220 causes the phase change material of the phase change storage element 110 (FIG. 1) to at least partly recrystallize at the crystallization temperature (Tcrys).

An operation to determine the state of the phase change storage element 110 (FIG. 1), or a READ operation, may be performed by applying a read pulse 230, e.g., a current or voltage pulse, and sensing the resulting electrical signal using a sense amplifier. The pulse can be applied using the selector device to control the duration and/or magnitude thereof.

It will be appreciated that various operations of the nonvolatile memory device as described herein can subject regions of the phase change storage element to relatively high electric field and temperatures as high as or exceeding the melting temperature of the phase change material, which can exceed several hundred degrees. As the PCM device can be cyclically subjected to such conditions more than tens or hundreds of thousands of times, one or more of SET, RESET or READ voltages or currents can degrade over time, leading to reliability failures. Some of the failures have been attributed to cross contamination of different regions of the PCM device, including the phase change storage element. Thus, meeting the competing characteristics for the electrode 120 to serve as an effective diffusion barrier, as well as various other functionalities described herein, can be particularly challenging.

Referring back to FIG. 1, the inventors have discovered that, by forming the electrode 130 comprising TiSiN by ALD, e.g., thermal ALD, according to embodiments, one of more of the SET, RESET and READ operations may be improved. For example, improved thermal insulation provided by the TiSiN material of the electrode 120 according to embodiments can in turn provide improved conservation of heat during SET and/or RESET operations, thereby reducing the energy and/or time of the respective operations. As another example, in some embodiments, the electrode 120 may be configured as a heating element to provide at least part of the heat for melting the phase change storage element 110 during SET and/or RESET operations. In these embodiments, by tuning the composition of TiSiN material of the electrode 130, the power generated by resistive heating of the electrode 120 may be advantageously tuned to optimize the respective operations. These and other advantages are further described below.

Forming Barrier or Electrode Comprising TiSiN for Phase Change Memory Device

Figure 3A:
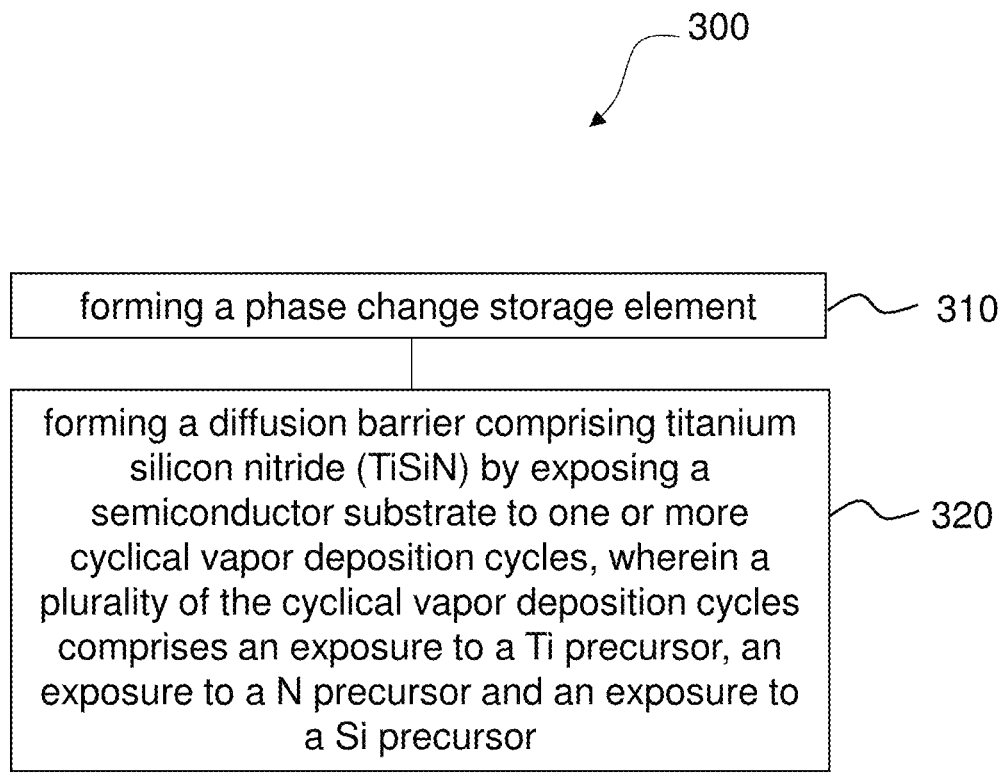
FIG. 3A is a flow chart illustrating a method of fabricating a phase change memory device, according to embodiments.

FIG. 3A illustrates a flow chart of a method 300 of forming a memory structure, e.g., a memory cell, of a phase change memory device comprising an electrode comprising TiSiN, according embodiments. The method 300 includes forming 310 over a semiconductor substrate a phase change storage element. The method 300 additionally includes forming 320 a diffusion barrier, which can also serve as an electrode, comprising titanium silicon nitride (TiSiN) by exposing the semiconductor substrate to one or more vapor deposition cycles, wherein a plurality of the vapor deposition cycles comprises an exposure to a titanium (Ti) precursor, an exposure to a nitrogen (N) precursor and an exposure to a silicon (Si) precursor.

As described herein and throughout the specification, it will be appreciated that the semiconductor substrate over which the diffusion barrier comprising TiSiN is formed can be implemented in a variety of substrates, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC. GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer (BOX). In addition, it will be appreciated that the various structures described herein can be at least partially formed in an epitaxial layer formed at or near a surface region.

While not shown for clarity and ease of illustration, it will be understood that the method 300 (FIG. 3) may be carried out over a substrate having been processed through the front-end-of-line, and can include various peripheral and/or supporting devices, for instance CMOS transistors that form a part of wordline and bitline driver circuitry and sense amplifier circuitry. Furthermore, the semiconductor substrate can include one or more of a variety of structures pre-formed thereon, e.g., phase change storage elements, selector devices, diffusion regions, isolation regions, electrodes, and metallization structures such as contacts and metallization lines, to name a few, over which the method 300 may be performed. The diffusion barrier comprising TiSiN may thus be formed on a variety of structures, including topological features such as vias, cavities, holes or trenches. The surfaces on which the diffusion barrier comprising TiSiN according to embodiments can be formed include a phase change material surface, e.g., a chalcogenide material surface; a metallic surface, e.g., a surface of a metallization structure; a semiconductor surface, e.g., a doped or undoped Si surface; and/or a dielectric surface, e.g., an interlayer dielectric (ILD) surface, a mask or a hard mask surface or a gate dielectric surface, to name a few.

Still referring to FIG. 3A, the method 300 of forming a memory structure comprises forming 310 over a semiconductor substrate a phase change storage element 110 (FIG. 1). Without limitation, the phase change material of the phase change storage element 110 can include a chalcogenide alloy composition including at least two of elements within the GeSbTe (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., or a chalcogenide alloy composition including at least two of elements within the InSbTe (IST) alloy system, e.g., $In_2Sb_2Te_5$, $In_1Sb_2Te_4$, $In_1Sb_4Te_7$, etc., among other chalcogenide alloy systems. Other chalcogenide alloy systems that include one or more chalcogenide elements, and are capable of undergoing a phase change in directly or indirectly in response to an electrical signal, may be used. A suitable deposition technique may be used to form a thin film layer from which the phase change storage element may be formed. For example, a thin film layer of the phase change material may be deposited using, e.g., physical vapor deposition, chemical vapor deposition and atomic layer deposition, to name a few examples, from which the phase change storage element 110 (FIG. 1) may be formed by a combination of suitable patterning techniques.

As described above with respect to FIG. 1, in some embodiments a diffusion barrier layer, which can serve as an electrode, comprising titanium silicon nitride (TiSiN) may be interposed between the phase change storage element (110 in FIG. 1) and an adjacent structure (130 in FIG. 1) comprising a selection device, to serve as a diffusion barrier therebetween, among other functionalities. In these embodiments, the selector device includes a suitable two terminal or three terminal device that can be used to switch the memory state of the phase change storage element. In some embodiments, the selector device can include a semiconductor device, e.g., a metal-silicon-oxide (MOS) transistor, a bipolar junction transistor (BJT), a silicon-controlled rectifier (a thrystor), a diac, a PN junction diode and a Schottky diode, to name a few. In some other embodiments, the selector device can include an Ovonic threshold switch (OTS), which is a bidirectionally symmetric two terminal switch. Some OTSes include a chalcogenide composition. However, unlike phase change materials, the chalcogenide materials of OTSes do not crystallize or undergo a phase change. Instead, upon application of a voltage or an electric field exceeding a threshold value thereacross, an OTS may turn on to conduct current therethrough, and upon removal of the voltage or the electric field, the OTS may turn off to block current from conducting therethrough. Without limitation, examples of chalcogenide alloy systems that can form an OTS include TeAsGeSi, GeTePb, GeSeTe, AlAsTe, SeAsGeSi, SeAsGeC. SeTeGeSi, GeSbTeSe, GeBiTeSe, GeAsSbSe, GeAsBiTe, and GeAsBiSe alloy systems, to name a few. A suitable combination of processing techniques may be used to form a thin film layer from which an OTS may be formed. For example, a thin film layer of the OTS material may be deposited using, e.g., physical vapor deposition, chemical vapor deposition and atomic layer deposition, to name a few examples, from which the selector device may be formed by a combination of suitable patterning techniques.

In some embodiments, a diffusion barrier layer, which can serve as an electrode, comprising titanium silicon nitride (TiSiN) may be interposed between the phase change storage element (110 in FIG. 1) and an adjacent structure (130 in FIG. 1) comprising a metallization structure to serve as a diffusion barrier therebetween, among other functionalities. In these embodiments, the metallization structure can include a metallization line, a contact structure or other conductive structures formed of a metal or a metallic material for electrically connecting the phase change storage element 110 to other parts of the PCM device. The metallization structure may be formed of any suitable metal or metallic material including, for example, metals including Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$, to name a few.

The location of the disclosed diffusion barrier layer is not so limited, and may be formed at any suitable location within a memory cell. For example, the diffusion barrier layer may be formed on any surface or interface of the phase change storage element 110 or any surface or interface of a selector device.

Still referring to FIG. 3A, the method 300 of forming a memory structure further comprises forming 320 an diffusion barrier, which may serve as an electrode, comprising titanium silicon nitride (TiSiN) by exposing a semiconductor substrate in a reactor chamber to one or more vapor deposition or atomic layer deposition (ALD) cycles, wherein at least one of the ALD cycles comprises one or more exposures to a titanium (Ti) precursor, one or more exposures to a nitrogen (N) precursor and one or more exposures to a silicon (Si) precursor.

As described herein and throughout the specification, a reactor chamber refers to any reaction chamber including a single wafer processing reaction chamber or a batch wafer processing reaction chamber that is suitably configured for cyclic vapor deposition or atomic layer deposition (ALD), e.g., thermal cyclic vapor deposition or ALD. In a thermal ALD reactor, the substrate may be placed on a suitable substrate such as a susceptor or a carrier boat. The substrate may be directly heated by conduction through a heated susceptor, or indirectly heated by radiation from a radiation source such as a lamp or by convection through a heated chamber wall.

Generally in a cyclic vapor deposition or ALD process, reactants or precursors, e.g., oxidizing and reducing reactants, are alternately introduced into a reaction chamber having disposed therein a substrate. The introduction of one or more reactants or precursors may be in turn be alternated with a purge and/or a pump out process for removing excess reactants or precursors from the reaction chamber. The reactants may be introduced into the reaction chamber under a condition over a suitable period of time such that the surface on which the diffusion barrier is to be deposited is exposed to the reactants, whereby the surface of the substrate can become at least partly saturated with the precursors or reactants and/or a reaction product of the reactants. Excess or residual precursors or reactants may then be purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. Other techniques also exist for keeping mutually reactive reactants from mixing in the gas phase.

Figure 3B:
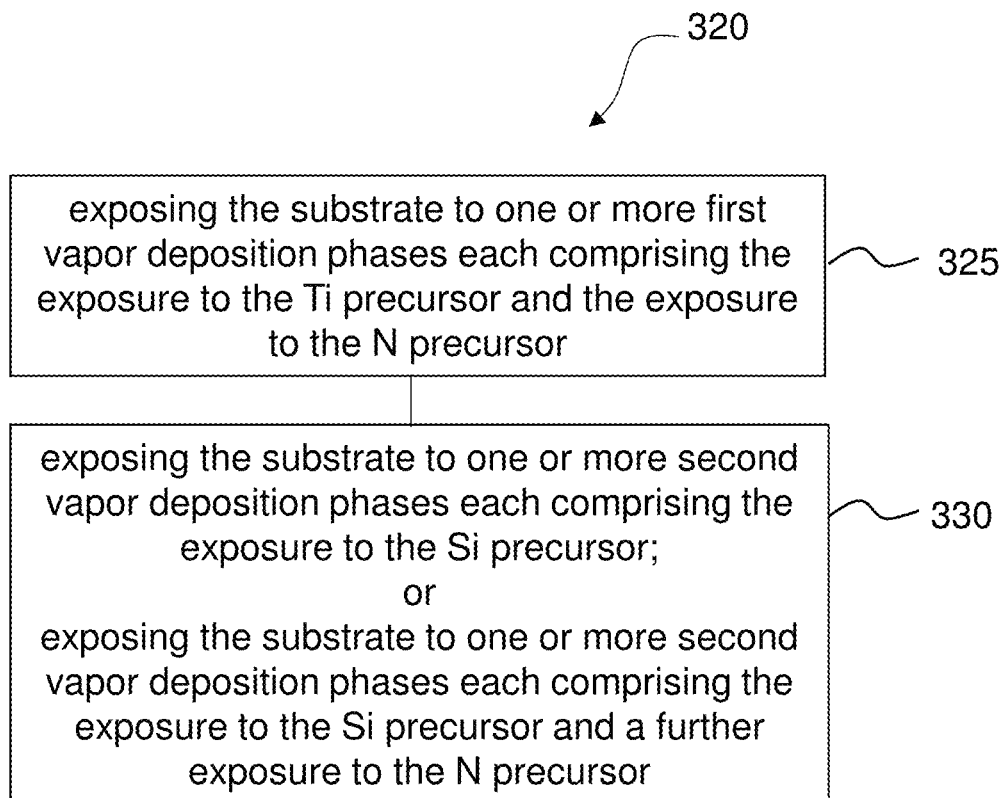
FIG. 3B is a flow chart illustrating a method of forming a diffusion barrier comprising TiSiN, according to embodiments.

FIGS. 3B and 3B are a flow chart and a diagram illustrating a method of forming an diffusion barrier comprising TiSiN, according to embodiments. Referring to FIG. 3B, according to various embodiments, exposing 320 (FIG. 3A) the semiconductor substrate to one or more vapor deposition cycles, which can be ALD cycles, comprises exposing 325 the substrate to one or more first vapor deposition phases ("first deposition phases"), wherein at least one of the first deposition phases comprises an exposure to the Ti precursor and an exposure to the N precursor. Exposing 320 (FIG. 3A) the semiconductor substrate to one or more vapor deposition cycles, which can be ALD cycles, additionally comprises exposing 330 the substrate to one or more second vapor deposition phases ("second deposition phases"), wherein at least one of the second deposition phases comprises an exposure to the Si precursor or a combination of an exposure to the Si precursor and a further exposure to the N precursor. The one or more first deposition phases and the one or more second deposition phases can combine to form one cycle, which in turn can be repeated a plurality of times. The combination of exposing 325 the substrate to one or more first deposition phases and exposing 330 to one or more second deposition phases results in an electrode layer comprising a TiSiN layer or region. Each of exposing 325 the substrate to one or more first deposition phases and exposing 330 the substrate to one or more second deposition phases, in turn, can comprise one or more exposures to respective precursors, such as in pulses, as described below.

Figure 3C:
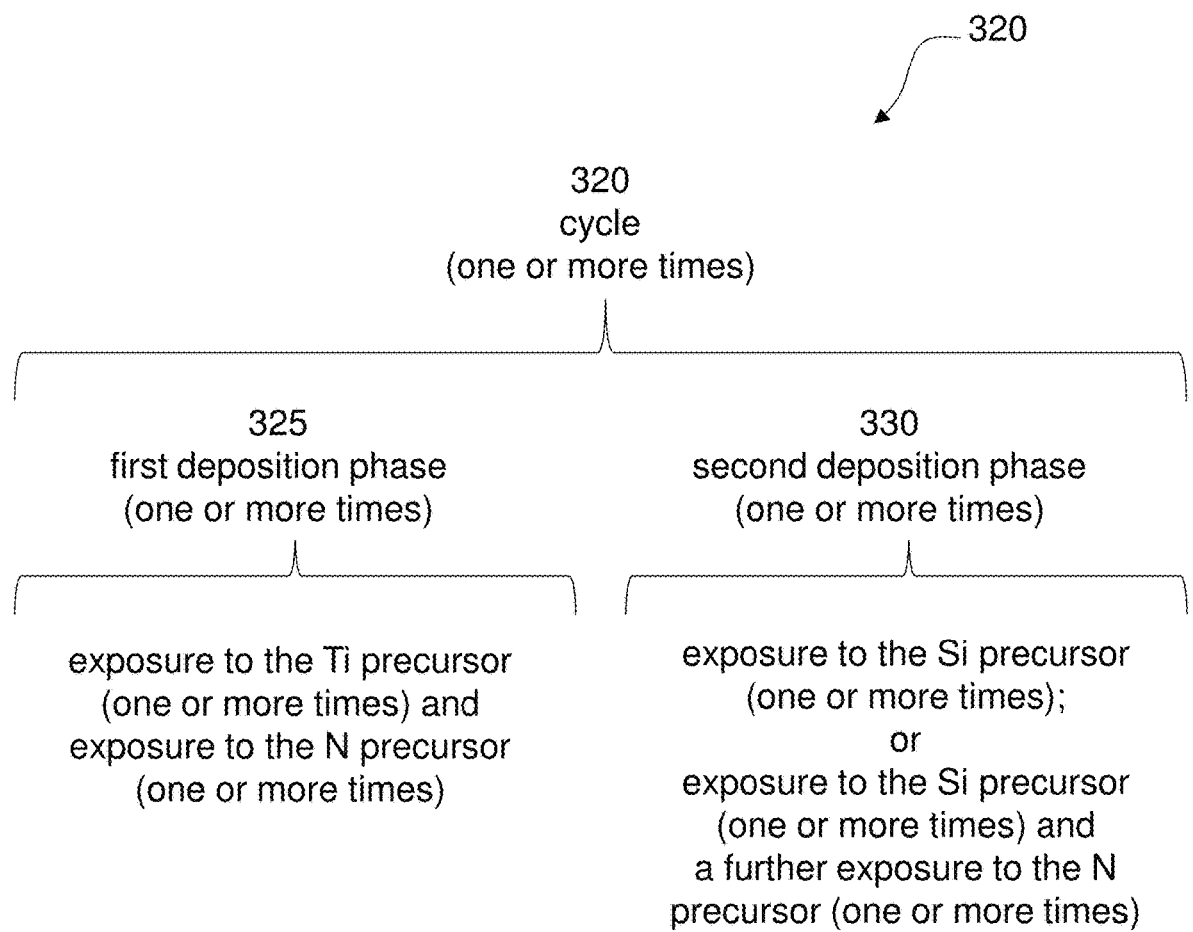
FIG. 3C is a diagram illustrating a method of forming a diffusion barrier comprising TiSiN, according to embodiments.

Still referring to FIGS. 3B and 3C, in various embodiments, exposing 325 the substrate to each of the one or more first deposition phases comprises subjecting the substrate to one or more exposures to the Ti precursor and one or more exposures to the N precursor. Each exposure to the Ti precursor is such that the surface of the substrate on which the diffusion barrier is to be deposited is exposed to the Ti precursor, whereby the surface can become substantially or partly saturated with the Ti precursor. After exposing the substrate to the Ti precursor, excess or residual Ti precursor or its reaction products that do not remain adsorbed or chemisorbed on the surface of the substrate may be removed from the substrate surface, such as by having the process chamber pumped or purged out. Similarly, each exposure to the N precursor is such that the substrate on which the diffusion barrier is to be deposited is exposed to the N precursor, whereby the surface can become substantially or partly saturated with the N precursor. After exposing the substrate to the N precursor, excess or residual N precursor or its reaction products that do not remain adsorbed or chemisorbed on the surface of the substrate may be removed from the substrate surface, such as by having the process chamber pumped or purged out. Subjecting the substrate to one or more first deposition phases each comprising one or more exposures to the Ti precursor and one or more exposures to the N precursor may locally form one or more monolayers or a region formed substantially of TiN as-deposited.

In some embodiments, the exposure to the Ti precursor in a given first deposition phase may be performed a plurality of times in sequence. Similarly, the exposure to the N precursor in a given first deposition phase may be performed a plurality of times in sequence. Advantageously, under some circumstances, exposing the substrate to the Ti and/or N precursors more than once may result in a higher level of surface saturation, e.g., when substantial stearic hindrance effect exists, by exposing more reactive sites for the respective precursor adsorption.

Still referring to FIGS. 3B and 3C, in various embodiments, exposing 330 the substrate to each of the one or more second deposition phases comprises subjecting the substrate to one or more exposures to the Si precursor. Each exposure to the Si precursor is such that the surface of the substrate on which the diffusion barrier is to be deposited is exposed to the Si precursor, whereby the surface can become substantially or partly saturated with the Si precursor. After exposing the substrate to the Si precursor, excess or residual Si precursor or its reaction products that do not remain adsorbed or chemisorbed on the surface of the substrate may be removed from the substrate surface, such as by having the process chamber pumped or purged out. Subjecting the substrate to one or more second deposition phases each comprising one or more exposures to the Si precursor may locally form one or more monolayers or a region formed substantially of Si as-deposited.

In some embodiments, the exposure to the Si precursor in a given second deposition phase may be performed a plurality of times in sequence. Advantageously, under some circumstances, exposing the substrate to the Si precursor more than once may result in a higher level of surface saturation, e.g., when substantial stearic hindrance effect exists, by exposing more reactive sites for the respective precursor adsorption.

Still referring to FIGS. 3B and 3C, in some embodiments, exposing 330 to the substrate to each of the one or more second deposition phases comprises subjecting the substrate to one or more exposures to the Si precursor and further subjecting the substrate to one or more exposures to a N precursor, which can be the same as or different from the N precursor of the first deposition phases. Each exposure to the Si precursor is such that the surface of the substrate on which the diffusion barrier is to be deposited is exposed to the Si precursor, whereby the surface can become substantially or partly saturated with the Si precursor. After exposing the substrate to the Si precursor, excess or residual Si precursor or its reaction products that do not remain adsorbed or chemisorbed on the surface of the substrate may be removed from the substrate surface, such as by having the process chamber pumped or purged out. Each exposure to the N precursor is such that the surface of the substrate on which the diffusion barrier is to be deposited is exposed to the N precursor, whereby the surface can become substantially or partly saturated with the N precursor. After the one or more further exposures to the N precursor, excess or residual N precursor or its reaction products that do not remain adsorbed or chemisorbed on the surface of the substrate may be removed from the substrate surface, such as by having the process chamber pumped or purged out. Subjecting the substrate to one or more second deposition phases each comprising one or more exposures to the Si precursor and one or more exposures to the N precursor may locally form one or more monolayers or a region formed substantially of SiN as-deposited.

In some embodiments, the exposure to the Si precursor in a given second deposition phase may be performed a plurality of times in sequence. Similarly, the further exposure to the N precursor may be performed a plurality of times in sequence. Advantageously, under some circumstances, exposing the substrate to the Si and/or N precursors as discussed herein more than once may result in a higher level of surface saturation, e.g., when substantial stearic hindrance effect exists, by exposing more reactive sites for the respective precursor adsorption.

It will be appreciated that, in various embodiments, number of cycles each including one or both of the first and second deposition phases, the frequency and number of repetition of the first deposition phases and the frequency and number of repetition of the second deposition phases, the frequency and the number of repetition of the exposures of the substrate to the Ti precursor and the N precursor during the first deposition phases, and the frequency and the number of repetition of the exposures of the substrate to the Si precursor or the Si precursor and the N precursor during the second deposition phases as described herein can be varied to obtain a desired thickness, stoichiometry and other properties described herein in the resulting diffusion barrier layer comprising TiSiN, based on various considerations including susceptibility to stearic hindrance effects of the precursors.

Still referring to FIGS. 3B and 3C, depending on the circumstances or the improvement being sought, it may be advantageous to initiate the deposition of the diffusion barrier comprising TiSiN with one or the other of the exposure of the substrate to a first or second deposition phase. For example, the inventors have found that, exposing 330 the substrate to one or more second deposition phases (Si precursor or N precursor) first, followed by exposing 325 the substrate to one or more first deposition phases (Ti precursor or N precursor), may be particularly advantageous in enhancing layer-by-layer growth mode of the diffusion barrier layer, thereby increasing conformality and reducing surface roughness, e.g., when the substrate surface comprises a nonmetallic surface, e.g., an insulating surface such as the sidewalls of a trench or a via formed in an interlayer dielectric (ILD) layer, or a semiconductor surface such as a Si diffusion region.

However, embodiments are not so limited and in other embodiments, it may be more advantageous to expose 325 the substrate to one or more first deposition phases (Ti precursor or N precursor) first, followed by exposing 330 the substrate to one or more second deposition phases (Si precursor or N precursor), in reducing contact resistance while maintaining good conformality and surface roughness, e.g., when the substrate surface comprises a metallic surface (e.g., a W, Al, or Cu metal metallization).

According to various embodiments, non-limiting examples of the Ti precursor for forming the diffusion barrier layer or region include titanium tetrachloride ($TiCl_4$), tetrakis(dimethylamino)titanium (TDMAT) or tetrakis(diethylamino)titanium (TDEAT).

According to various embodiments, non-limiting examples of the N precursor for forming the diffusion barrier layer or region include ammonia (NH$_3$), hydrazine (N$_2$H$_4$) or monomethylhydrazine (CH$_3$(NH)NH$_2$, "MMH"). As noted above, different N precursors can be employed for the first and second deposition phases, and indeed different precursors can be used for different cycles of the same phase.

According to various embodiments, non-limiting examples of the inert gas for purging include nitrogen N$_2$ or a noble gas such as Ar.

According to some embodiments, the Si precursor for forming the diffusion barrier layer may be a hydride precursor. Examples of the hydride precursor include silane (SiH$_4$) and disilane (Si$_2$H$_6$). According to some other embodiments, the Si precursor for forming the diffusion barrier layer may be a silicon chloride or a chlorosilane. Examples include silicon tetrachloride (SiCl$_4$), monochlorosilane (SiH$_3$Cl, "MCS"), dichlorosilane (SiH$_2$Cl$_2$, "DCS"), trichlorosilane (SiHCl$_3$), hexachlorodisilane (Si$_2$Cl$_6$, "HCDS") and octachlorotrislane (Si$_3$Cl$_8$, "OCTS"). The inventors have found that the diffusion barrier layer comprising TiSiN may be desirably formed using a silicon and chlorine-containing Si precursor when a higher level of saturation of the surface by the precursor is desired under a wide variety of conditions. Without being bound to any theory, the inventors have found that these Si precursors, when introduced as the first non-nitrogen precursor, can be particularly advantageous for enhancing a layer-by-layer growth mode of the TiSiN layer, compared to other Si precursors. The layer-by-layer growth mode is achieved through improved wetting of the substrate surface by nuclei of the TiSiN layer during early stages of growth, which may be characterized by a small contact angle between the nuclei and the substrate surface. As a result of the layer-by-layer growth mode, improved conformality and reduced surface roughness may be achieved, which can be particularly advantageous for forming the diffusion barrier by depositing in high aspect ratios with small dimensions. Further, without being bound to any theory, the chlorine-containing Si precursor may enable more precise control of composition in the direction of growth by inhibiting or self-limiting adsorption.

Various technical advantages and benefits described herein can be realized when the diffusion barrier layer comprising TiSiN is formed a substrate temperature of 200° C.-250° ° C., 250° C.-300° ° C., 300° C.-350° ° C., 350° C.-390° ° C., 350° C.-400° ° C., 400° ° C.-450° ° C., 450° C.-500° ° C., 500° C.-550° C., 550° C.-600° ° C., 600° C.-650° ° C., or a temperature in a range defined by any of these values, for instance about 400° C., according to embodiments. As discussed above, the disclosed methods can advantageously be performed at a deposition temperature that does not exceed the thermal budget for most back-end-of-line (BEOL) part of the process flow, which can be as low as 400° ° C. or below. Furthermore, when formed after forming a phase change storage element, the diffusion barrier layer may advantageously be formed at a deposition temperature that does significantly change the nanostructure or microstructure of the phase change storage element. For example, when it is advantageous for the phase change storage element to contain an amorphous phase as formed, the low deposition temperature of a subsequent diffusion barrier layer can suppress substantial crystallization of the amorphous phase. Thus, according to embodiments, the diffusion barrier layer is formed at a temperature lower than a crystallization temperature of the phase change storage element. Having an amorphous phase in the storage element as-formed may be advantageous, e.g., for reliability testing after fabrication of the phase change memory device.

Thus, according to embodiments, total reaction chamber pressure or partial pressures of the of any of the individual precursors in the reaction chamber during exposing the substrate to the Ti precursor, the Si precursor and/or the N precursor, may be 0.001.0-3.0 torr, 3.0-5.0 torr, 5.0-7.0 torr, 7.0-10.0 torr, or a pressure in range defined by any of these values. In each of the exposures to the Ti precursor, the N precursor and/or the Si precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, conformality or step coverage may start to degrade, among other things.

In various embodiments, the exposure times or pulse times of the various precursors are in the range of about 0.1 and 60 seconds.

According to various embodiments, when forming an diffusion barrier layer comprising TiSiN, a ratio of the number of exposures of the substrate to the first deposition phases (each comprising a combination of exposures to the Ti precursor and the N precursor) to the number of exposures of the substrate to the second deposition phases (each comprising an exposure to the Si precursor or a combination of exposures to the Si precursor and the N precursor) may be about 1:30-1:15, 1:15-1:6, 1:6-1:3, 1:3-1:2, 1:2-2:3, 2:3-5:6, 5:6-1:1, 1:1-6:5, 6:5-3:2, 3:2-2:1, 2:1-3:1, 3:1-6:1, 6:1-15:1, 15:1-30:1, or a ratio in a range defined by any of these values. Alternatively, exposures to the Ti precursor and the Si precursor can have these ratios. Under the combination of process conditions described herein for forming the diffusion barrier comprising TiSiN, the ratio of the exposures to the first deposition phases to the exposures to the second deposition phases is such that Si is present in the diffusion barrier at an average concentration exceeding about 1%, 3%, 10%, 20%, 30%, 40%, 50%, 60%, 70%, 80%, 90%, or a value in a range defined by any of these values, on the basis of the total number of atoms in the diffusion barrier.

In summary, forming 320 an diffusion barrier, which may serve as an electrode, comprising TiSiN comprises exposing a substrate to one or more cycles each including one or more first deposition phases and/or one or more second deposition phases. Each of the first deposition phases in turn comprises one or more exposures to a Ti precursor alternating with one or more exposures to a N precursor. According to some embodiments, each of the second deposition phases in turn comprises one or more exposures to a Si precursor. According to some other embodiments, each of the second deposition phases comprises one or more exposures to a Si precursor alternating with one or more exposures to a N precursor. The resulting diffusion barrier layer comprises a TiSiN layer or region. According to various embodiments, the frequency and the number of exposures of the substrate to each of the Ti precursor, the N precursor and the Si precursor, and the frequency and the number of exposures of the substrate to each of the cycles, first deposition phases and second deposition phases, as well as the order of the exposures, may be tailored to obtain a desired stoichiometry, thickness and degree of crystallinity, as described infra.

The diffusion barrier formed according to embodiments can have a thickness, which can be tailored for a particular memory cell architecture, that does not exceed about 20 nm, 15 nm, 10 nm, 7 nm, 4 nm, 2 nm, or a thickness having a value in a range defined by any of these values.

The inventors have found that, advantageously, when the diffusion barrier layer is formed according to embodiments disclosed herein, the surface roughness can be reduced compared to other diffusion barrier materials used for phase change memory element, e.g., TiN, or TiSiN formed using other techniques, e.g., CVD or PVD. The reduced surface roughness is particularly advantageous compared to other materials or techniques when the surface on which the diffusion barrier is deposited comprises a nonmetallic surface, e.g., a dielectric surface and/or a semiconductor surface exposed by an opening such as a via or a trench. As deposited, the diffusion barrier having the above-indicated thicknesses can have a root-mean square (RMS) surface roughness of 0.1%, 0.5%, 1%, 1.5%, 2%, 2.5%, 3%, 3.5%, 4%, 4.5% and 5%, on the basis of an average thickness of the diffusion barrier, or a value in a range defined by any of these values. Alternatively, as-deposited, the diffusion barrier having the above-indicated thicknesses can have a root-mean square (RMS) surface roughness value that is less than 0.5 nm, 0.4 nm, 0.3 nm, 0.2 nm, 0.1 nm, or a value in a range defined by any of these values. The reduced RMS roughness can in turn improve the conformality of the diffusion barrier layers. Furthermore, by reducing asperities, the diffusion barrier layers comprising TiSiN can reduce variability in switching parameters, e.g., current, voltage and/or duration of SET and RESET switching operations described above, of a phase change storage element in contact with the TiSiN layer.

Resistivity and Crystallinity Tuning with Si Precursor Exposures

Phase change memory devices can have different memory cell architectures. In some cell architectures, a substantial part of the heat that induces the phase changes in the phase change storage element can be provided externally, e.g. by resistive heating of an electrode in contact therewith. In these cell architectures, it may be advantageous to configure the electrode providing the heat to the phase change storage element to have a relatively high resistance to serve as an effective heater. In some other cell architectures, a substantial part of the heat that induces the phase changes may be generated by resistive self-heating of the phase change storage element. In these cell architectures, it may be advantageous to configure the electrode of the phase change storage element to have a relatively low resistance to reduce excess voltage drop thereacross. Advantageously, the methods of forming the electrodes according to embodiments disclosed herein can be used to tune the resistivity of the electrode over a relatively wide range of values by tuning the relative Si content thereof. Thus, the electrodes according to different embodiments disclosed herein can serve as electrodes in various PCM cell architectures.

Figure 4:
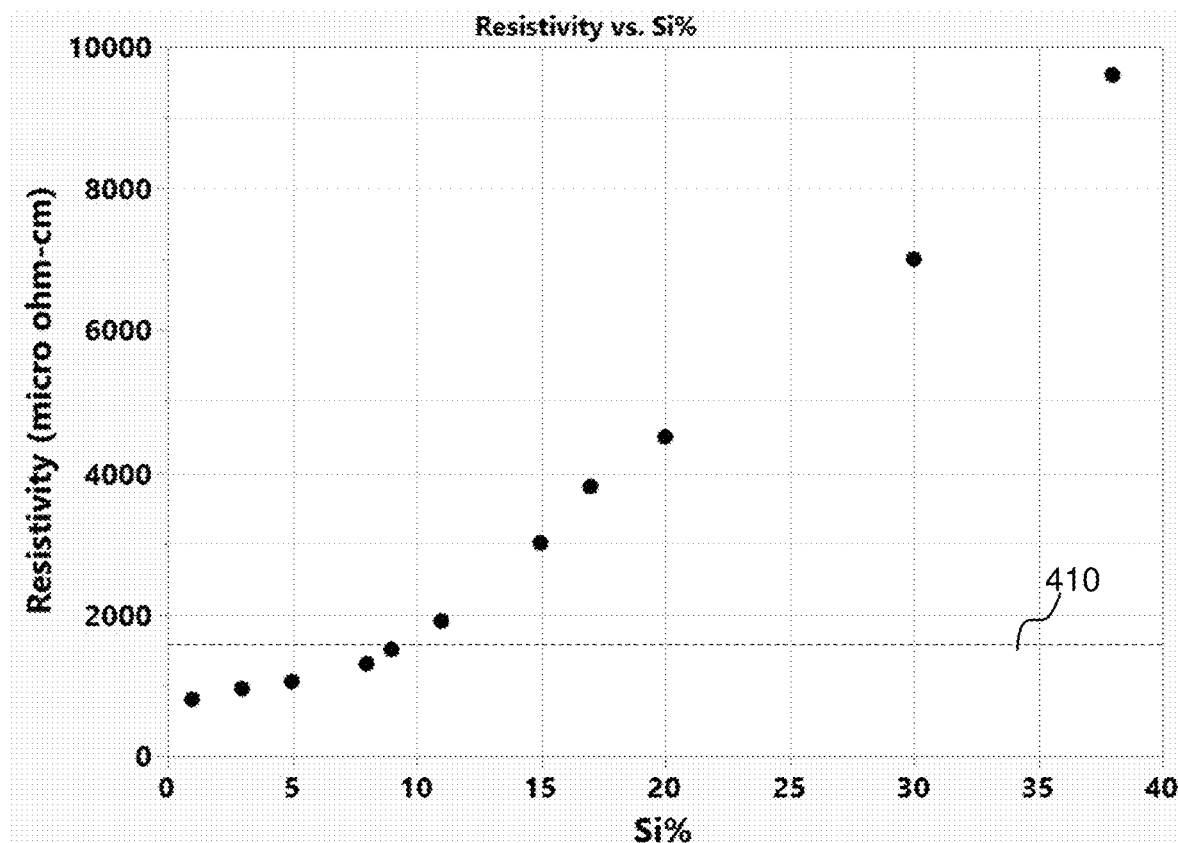
FIG. 4 is a graph of experimentally measured resistivity as a function of silicon content for diffusion barrier layers comprising TiSiN, according to embodiments.

FIG. 4 is a graph of experimentally measured resistivity as a function of silicon content for electrodes comprising TiSiN, according to embodiments. The graph illustrates that the resistivity of the electrode can be tuned over a wide range of values by tuning the relative Si content in the electrode, which can in turn be tuned by tuning the number of exposures to a Si precursor in the ALD cycle. The inventors have found that, while the resistivity of the electrode increases relatively slowly as a function of Si precursor exposures for relatively low number of exposures thereof, the resistivity of the electrode increases relatively fast in a nonlinear fashion as a function of Si precursor exposures for relatively high number of exposures. The inventors have further found that the relatively fast increase in resistivity as a function of Si precursor exposures at for relatively high number of exposures generally coincides with an onset 410 of the emergence of an amorphous phase of TiSiN, as verified experimentally by transmission electron microscopy.

Thus, in PCM devices having memory cell architectures where it is advantageous to have an electrode having a relatively high resistivity, relatively high diffusion barrier capability, relatively high thermal resistivity and/or relatively low surface roughness, the composition of the electrode layer can advantageously be tuned such that the electrode comprising TiSiN is at least partially amorphous. In these implementations, the electrode may be substantially entirely amorphous or comprise nanocrystalline regions surrounded by an amorphous matrix. For example, the electrode may include TiSi, TiN and/or TiSiN nanocrystals in an amorphous matrix including Ti, Si and N. In the illustrated embodiment, the onset 410 at about 1600 µΩ-cm corresponds to an average atomic concentration of Si of about 8% of the TiSiN layer. However, embodiments are not so limited, and in other embodiments, the onset may occur at an average atomic concentration of Si of about 5%, 10%, 15%, 20% or 25%, or a value in a range defined by any of these values, of the TiSiN layer, depending on the deposition conditions and the precursors used. Alternatively, the onset 410 corresponds to a ratio of the number of exposures of substrate to the one or more first deposition phases (each comprising a combination of exposures to the Ti precursor and the N precursor) to the number of exposures of the substrate to the one or more second deposition phases (each comprising an exposure to the Si precursor or a combination of exposures to the Si precursor and the N precursor) of 1:1-2:1, 2:1-3:1, 3:1-6:1, 6:1-15:1, 15:1-30:1, or a ratio in a range defined by any of these values, Alternatively, these ratios can represent the ratio of the number of exposures to the Ti precursor to the number of exposures to the N precursor.

The TiSiN electrode can have an electrical resistivity of <500 µΩ-cm, 500-1000 µΩ-cm, 1000-2000 µΩ-cm, 2000-3000 µΩ-cm, 3000-4000 µΩ-cm, 4000-5000 µΩ-cm, 5000-6000 µΩ-cm, 6000-7000 µΩ-cm, 7000-8000 µΩ-cm, 8000-9000 µΩ-cm, 9000-10,000 µΩ-cm, 10,000-15,000 µΩ-cm, 15,000-20,000 µΩ-cm, 20.000-25,000 µΩ-cm, 25,000-30,000 µΩ-cm, or greater than 30,000 µΩ-cm, or a value in a range defined by any of these values.

Example Implementations of TiSiN Electrode in Phase Change Memory Devices

Figure 5:
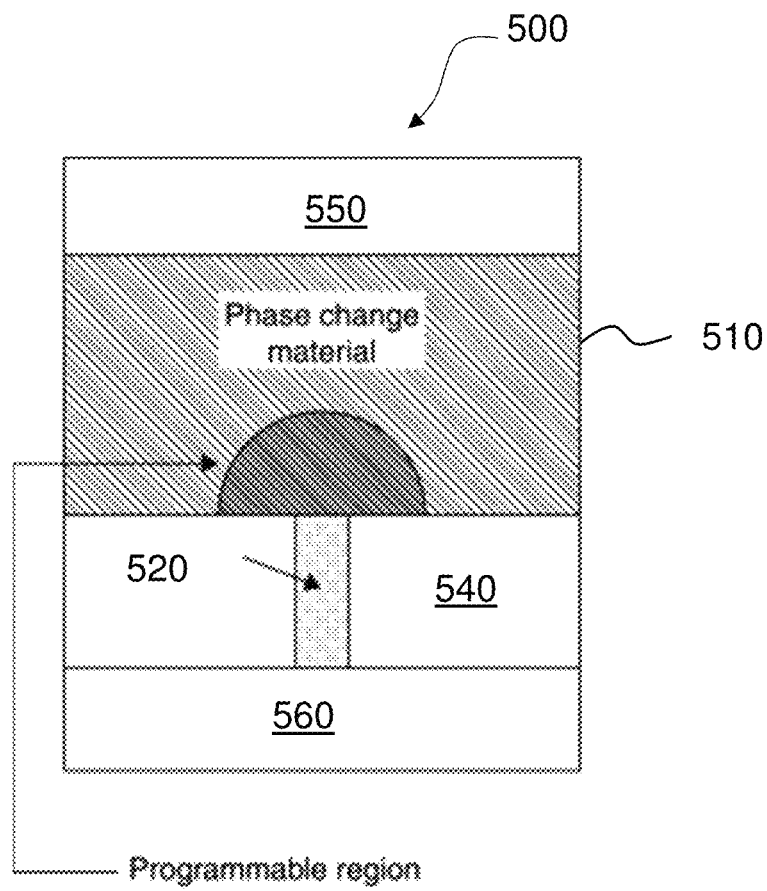
FIG. 5 is an example of a phase change memory cell including a phase change storage element formed on an electrode comprising TiSiN configured as a heater electrode, according to embodiments.

FIG. 5 is an example of a phase change memory (PCM) device 500 or cell in which at least one electrode comprising TiSiN can be implemented, according to embodiments. The PCM device 500 includes a phase change storage element 510 having formed on a bottom side an electrode 520, e.g., a heater electrode, and on a top side a top electrode 550. According to embodiments, one or both of the electrode 520 and the top electrode 550 comprises TiSiN, according to embodiments. As illustrated, the electrode 520 comprising TiSiN may have a vertical contact structure formed through an insulator 540, e.g., interlayer dielectric (ILD), extending vertically to electrically connect the phase change storage element 510 to a metallization structure 560. The metallization structure 560, which may be a metallization line, may in turn be connected to any of the selector devices described above, e.g., a transistor device (not shown), formed on a substrate. In the illustrated PCM device 500, a substantial part of the heat that induces the phase changes in the phase change storage element 510 is provided by resistive heating of the electrode 520 in contact therewith. To increase the resistance and the heat generation, the width or cross-sectional area of the electrode 520 contacting the phase change storage element 510 may be designed to be smaller compared to the width or cross-sectional area of the phase change storage element 510, as shown. However, embodiments are not so limited, and the widths or cross-sectional areas of the electrode 520 and the phase change storage element 510 may be designed to be substantially similar (e.g., within 20% or 10%), particularly in view of the ability to tune resistivity of the electrode 520 as taught herein.

To increase the resistance and the heat generation by the electrode 520, various parameters including the resistivity, length and the cross sectional area of the electrode 520 may be optimized to increase the resistance of the electrode 520 for Joule heating. In various existing memory cell architectures similar to the cell architecture illustrated in FIG. 5, electrode materials (e.g., C, TiN, TaN W and WN) having relatively low resistivity are used, and to enhance the heating, the length of the electrode 520 may be increased, the cross-sectional area of the electrode 520 may be decreased, or both. However, it will be appreciated that both increasing the length and decreasing the cross-sectional area increases the aspect ratio of a via or trench that may be filled to form the electrode 520. In addition, with continued scaling of memory cell sizes, forming such contact structures by filling a high aspect ratio via or trench becomes increasingly difficult with existing techniques such as PVD or CVD.

In addition, while plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances, or the degree of reactivity of plasma reactants may change with depth. In these circumstances, different portions of vias may be exposed to different amounts of the plasma energy or reactivity, leading to undesirable structural effects of non-uniform deposition, such as thicker films being deposited near the opening of the via compared to deeper portions (sometimes called cusping or keyhole formation). For these reasons, a thermal ALD may be more advantageous, because thermal ALD does not depend on the ability of the plasma to reach portions of the surface being deposited on.

The inventors have discovered that the methods of forming an electrode comprising TiSiN according to embodiments addresses these and other technological challenges by providing a method of filling a high (e.g., >1) aspect ratio via or a trench by successive layer-by-layer deposition of conformal TiSiN layers therein as described above, and by providing a method of tuning the resistivity of the resulting electrode by tuning the Si content, e.g., by controlling the ratio of exposures of the deposition phases and/or the individual precursors. It will be appreciated that, when techniques such as PVD or CVD are used to fill high aspect ratio vias or trenches, the deposition rate may be higher near the opening of the via or the trench compared to the bottom regions thereof, which can result in the resulting electrode having enclosed therein a void or a "keyhole." Such voids can even result when plasma-enhanced ALD is employed, because plasma may not be sustained in deep and narrow structures. Such voids can uncontrollably increase the resistance of the electrode and cause other integration issues, such as creating electrical shorts further downstream in the process flow of integrating the PCM device 500. Advantageously, in the thermal cyclic vapor deposition or ALD methods disclosed herein, because each of the successive layers formed according to the disclosed ALD method fills the via or the trench by conformally lining the deposition surface, the resulting electrode 520 has a further advantage that the formation of voids or "keyholes" may be substantially reduced or eliminated. Furthermore, the thermal cyclic deposition or ALD methods according to embodiments are adapted to fill a via or a trench having an aspect ratio exceeding 1, 2, 5, 10, 20, or a value in a range defined by any of these values by successive layer-by-layer deposition of conformal TiSiN layers. Thus, in cell architectures in which the electrode 520 has a vertical contact structure, which may be configured as a heater electrode to provide at least part of the heat for switching, the electrode 520 comprising TiSiN may be formed by filling a via or a trench formed through the insulator 540. The via or the trench may be formed by exposing the surfaces of the via or the trench, which may include a nonmetallic surface, e.g., a surface comprising an ILD material, to one or more vapor deposition cycles, wherein at least one of the vapor deposition cycles comprises an exposure to a titanium (Ti) precursor, an exposure to a nitrogen (N) precursor and an exposure to a silicon (Si) precursor, as described above. After filling the via or the trench with TiSiN, excess TiSiN deposited outside of the via or the trench may be removed using, e.g., chemical mechanical polishing. The phase change storage element 510 can subsequently be formed thereon.

In addition to the improved capability filling high aspect ratio vias or trenches as described above, the ability to tune the resistivity of the electrode material may provide a further advantage by enabling a reduction in the aspect ratio (e.g., a ratio of the depth over an opening width) of the via or the trench that may be filled to form the electrode 520 to begin with, while maintaining or increasing the relatively high resistance of the electrode 520 to serve as an effective heater. As described in reference to FIG. 4, the method of forming the electrode 520 according to embodiments can allow for tuning of the resistivity of the deposited TiSiN material over a wide range spanning over a decade, e.g., from less than 1000 $\mu\Omega$-cm to greater than 10000 $\mu\Omega$-cm. By increasing the resistivity of the electrode material, the ratio of the length over cross sectional area of the electrode can be proportionally decreased. In some embodiments, the composition of the electrode 520 may be tuned such that the average atomic concentration of Si corresponds to or is greater than the onset 410 (FIG. 4) of an amorphous phase of TiSiN, as described above.

Additional advantages of the electrode 520 comprising TiSiN exist. Because of lower thermal conductivity of TiSiN compared to other electrode materials, e.g., TiN and W, the thermal energy dissipated to induce the phase changes in the phase change storage element 510 may be substantially reduced. In addition, because the electrode 520 has relatively low surface roughness as described above, the variability of switching and read parameters for the phase change storage element 510 may be improved. In addition, because the electrode 520 has improved diffusion barrier properties as described above, contamination/cross contamination of the phase change storage element 510 by or with adjacent materials may be substantially suppressed.

In some embodiments, the top electrode 550 includes TiSiN according to embodiments, to further enhance the resistive heating, thermal insulation, diffusion barrier capability and/or switching/read parameter uniformity of the phase change storage element 510 in a similar manner as described above. However, embodiments are not so limited, and the top electrode 550 may be formed of any other suitable electrode material, including, for example, carbon (C); n-doped polysilicon and p-doped polysilicon; metals including Al, Cu, Ni, Cr, Co, Ru, Rh, Pd, Ag, Pt, Au, Ir, Ta, W and WN; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$, to name a few.

While not illustrated, a top metallization line may be formed on the top electrode 550, and can include Al, Cu and W, among other suitable materials. When the top electrode 550 comprises TiSiN according to embodiments, it can serve as an effective diffusion barrier between the phase change storage element 510 and the metallization line.

Figure 6:
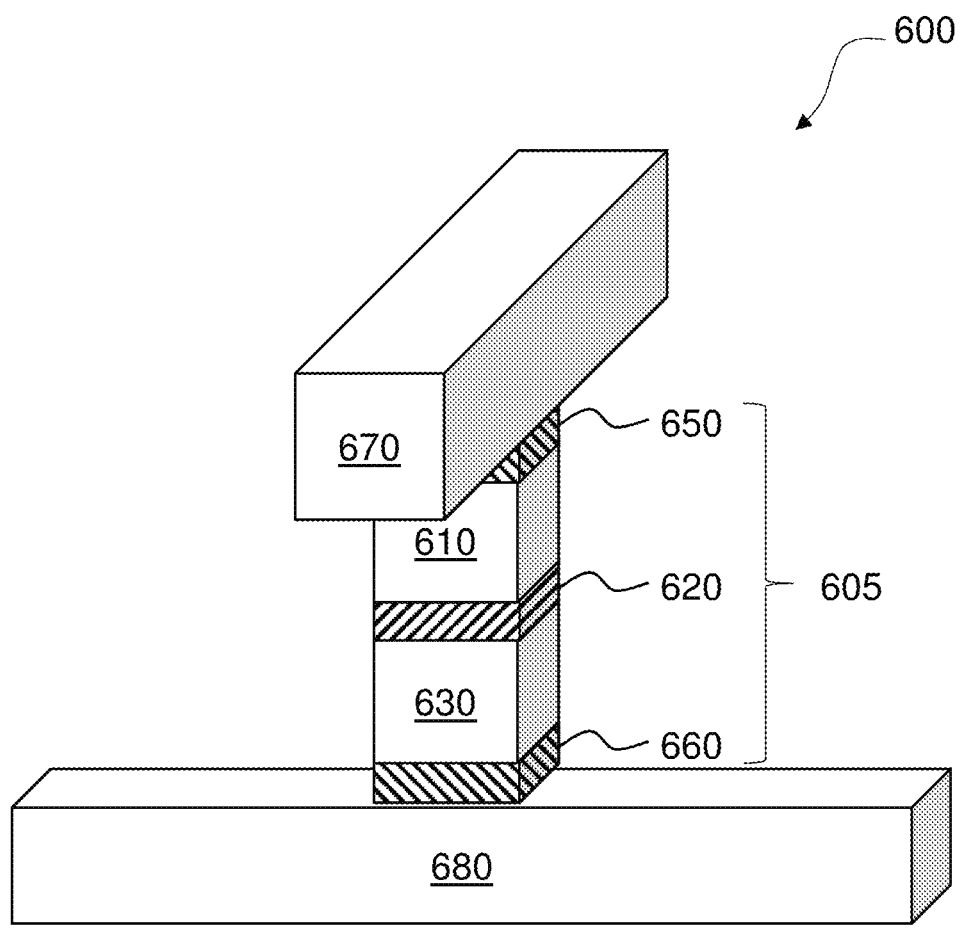
FIG. 6 is an example of a phase change memory cell including a phase change storage element formed on an electrode comprising TiSiN, according to embodiments.

FIG. 6 is another example of a phase change memory (PCM) device 600 or cell in which at least one electrode comprising TiSiN can be implemented, according to embodiments. The PCM device 600 includes a cell stack 605 including a phase change storage element 610 having formed on a bottom side an electrode 620, e.g., a diffusion barrier electrode, and on a top side a top electrode 650. According to embodiments, one or both of the electrode 620 and the top electrode 650 comprises TiSiN, according to embodiments. The cell stack 605 may additionally include a selector device 630 which may be separated from the phase change storage element 610 by the electrode 620, and a bottom electrode 660. The selector device 630 may be any of the selector devices described above, e.g., a two-terminal device such as an OTS. The cell stack 605 including the phase change storage element 610 and the selector device 630 may in turn be connected at one end through the top electrode 650 to a top metallization line 670, e.g., one of a wordline and a bitline, and at the other end through the bottom electrode 660 to a bottom metallization line 680, e.g., the other of the wordline and the bitline.

Unlike the cell architecture described above with respect to FIG. 5, in which a substantial part of the heat for the phase changes in the phase change storage element 610 is provided by resistive heating of the electrode in contact therewith, the PCM device 600 has a cell architecture in which a substantial part of the heat that induces the phase changes in the phase change storage element 610 is generated by resistive self-heating thereof. In these cell architectures, it may be advantageous to configure the electrode of the phase change storage element to have a relatively low resistance to reduce excess voltage drop thereacross. Thus, the width or cross-sectional area of the electrode 620 contacting the phase change storage element 610 may be designed to be comparable (e.g., within about 20% or 10%) to the width or cross-sectional area of the phase change storage element 610.

In part owing to the enhanced diffusion barrier properties and reduced surface roughness of the electrode 620 compared to other electrode materials, e.g., TiN or W, or TiSiN formed by other methods, the electrode 620 can be substantially reduced in thickness without sacrificing the barrier capability, surface smoothness and/or thermal insulation capability, among other advantages. The reduction in thickness can in turn enable substantial reduction of the overall height of the cell stack 605 as well as operational voltages, thereby facilitating the integration of the PCM device 600 among other advantages. Various other advantages and benefits of having the electrode 620 comprising TiSiN described above with respect to FIG. 5 may be realized in the PCM device 600, and the details associated with each above are omitted herein for brevity.

In some embodiments, the top electrode 650 includes TiSiN according to embodiments, to further enhance the resistive heating, thermal insulation, diffusion barrier properties and/or switching parameter uniformity of the phase change storage element 610 in a similar manner as described above. While not illustrated, a top metallization line may be formed on the top electrode 650, and can include Al, Cu and W, among other suitable materials. Thus, the electrode 620 may serve as a diffusion barrier against contamination between the phase change storage element 610 and the storage device 630 on one side of the phase change storage element 610, and the top electrode 650 may serve as a diffusion barrier against contamination between the phase change storage element 610 and the top metallization line 670 on the other side of the phase change storage element 610.

However, the top electrode 650 may be formed of any other suitable electrode material, including, for example, carbon (C); n-doped polysilicon and p-doped polysilicon; metals including Al, Cu, Ni, Cr, Co, Ru, Rh, Pd, Ag, Pt, Au, Ir, Ta, W and WN; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$, to name a few.

Examples of suitable materials for the top metallization line 670 include Al, Cu and W, among other suitable materials, and the top electrode 650 comprising the TiSiN according to embodiments can serve as an effective diffusion barrier between the phase change storage element 610 and the metallization line 670, in a similar manner as the electrode 620 serving as an effective diffusion barrier between the phase change storage element 610 and the selector device 630.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise." "comprising." "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein." "above." "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could." "might." "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of forming a diffusion barrier for an integrated circuit device, the method comprising:
    forming the diffusion barrier comprising TiSiN without aid of a plasma by exposing a substrate to one or more vapor deposition cycles, each of the vapor deposition cycles comprising alternating exposures to one or more first deposition phases followed by one or more second deposition phases,
    wherein each of the one or more first deposition phases comprises sequential exposures of the substrate to a titanium (Ti) precursor comprising $TiCl_4$ alternating with a nitrogen (N) precursor,
    wherein each of the one or more second deposition phases comprises sequential exposures of the substrate to a silicon (Si) precursor alternating with a N precursor, and
    wherein in at least one of the first deposition phases, the exposure to the N precursor follows the exposure to the Ti precursor without an intervening exposure to the Si precursor.

2. The method of claim 1, wherein forming the diffusion barrier comprises exposing the substrate to one or more vapor deposition cycles at a temperature lower than 400° C.

3. The method of claim 1, wherein forming the diffusion barrier comprises exposing the substrate to the one or more vapor deposition cycles at a temperature greater than 200° C. and less than 400° C.

4. The method of claim 1, wherein the diffusion barrier is at least partially amorphous.

5. The method of claim 1, wherein forming the diffusion barrier comprises adjusting a silicon concentration such that the diffusion barrier has an electrical resistivity between about 500 μΩ-cm and about 30,000 μΩ-cm.

6. The method of claim 1, wherein the diffusion barrier has a silicon concentration exceeding about 5 atomic %.

7. The method of claim 1, wherein the Si precursor is a precursor selected from the group consisting of $SiH_4$, $Si_2H_6$, $SiH_2Cl_2$, $SiH_3Cl$, $Si_2Cl_6$ and $Si_3Cl_8$.

8. The method of claim 1, wherein the substrate comprises a via or a trench formed through an insulating layer, and wherein forming the diffusion barrier comprises filling the via or the trench with successively grown conformal TiSiN layers.

9. The method of claim 1, wherein at least some of the first deposition phases locally forms TiN.

10. The method of claim 9, wherein forming the diffusion barrier layer comprises forming by thermal atomic layer deposition without aid of a plasma.

11. The method of claim 9, wherein the Si precursor is a precursor selected from the group consisting of $SiH_4$, $Si_2H_6$, $SiH_2Cl_2$, $SiH_3Cl$, $Si_2Cl_6$ and $Si_3Cl_8$.

12. The method of claim 9, wherein exposing the substrate to the one or more vapor deposition cycles comprises:
    exposing the substrate to one or more first deposition phases each comprising the exposure to the Ti precursor and the exposure to the N precursor; and
    exposing the substrate to one or more second deposition phases each comprising the exposure to the Si precursor.

13. The method of claim 12, wherein each of the second deposition phases further comprises a further exposure to the N precursor.

14. The method of claim 12, wherein at least some of the first deposition phases locally forms TiN.

15. The method of claim 12, wherein at least some of the second deposition phases locally forms SiN.

16. The method of claim 1, wherein at least some of the second deposition phases locally forms SiN.

17. A method of forming an integrated circuit structure, the method comprising:
    forming a diffusion barrier layer over a substrate, the diffusion barrier layer comprising titanium silicon nitride (TiSiN), at a temperature between 200° C. and 390° C. by exposing the substrate to one or more vapor deposition cycles, wherein each of the one or more vapor deposition cycles comprises an exposure to a titanium (Ti) precursor comprising $TiCl_4$, an exposure to a nitrogen (N) precursor and an exposure to a silicon (Si) precursor,
    wherein the exposure to the N precursor follows the exposure to the Ti precursor without an intervening exposure to the Si precursor; and
    forming a metallization line on the diffusion barrier layer.

18. The method of claim 17, wherein the substrate comprises a trench, and wherein forming the diffusion barrier layer comprises lining the trench with the diffusion barrier layer.

19. The method of claim 17, wherein the metallization line comprises a wordline for a nonvolatile memory device.

* * * * *